United States Patent
Li et al.

(10) Patent No.: US 7,893,502 B2
(45) Date of Patent: Feb. 22, 2011

(54) THRESHOLD VOLTAGE IMPROVEMENT EMPLOYING FLUORINE IMPLANTATION AND ADJUSTMENT OXIDE LAYER

(75) Inventors: Weipeng Li, Beacon, NY (US); Dae-Gyu Park, Poughquag, NY (US); Melanie J. Sherony, Fishkill, NY (US); Jin-Ping Han, Fishkill, NY (US); Yong Meng Lee, Beacon, NY (US)

(73) Assignees: International Business Machines Corporation, Armonk, NY (US); Chartered Semiconductor Manufacturing, Ltd., Singapore (SG); Infineon Technologies AG (DE)

( * ) Notice: Subject to any disclaimer, the term of this patent is extended or adjusted under 35 U.S.C. 154(b) by 0 days.

(21) Appl. No.: 12/465,908

(22) Filed: May 14, 2009

(65) Prior Publication Data

US 2010/0289088 A1  Nov. 18, 2010

(51) Int. Cl.
 *H01L 21/8238* (2006.01)
(52) U.S. Cl. ............... 257/369; 257/392; 257/E27.062; 257/310
(58) Field of Classification Search .................. 257/204, 257/274, E27.062–E27.067, E27.108
See application file for complete search history.

(56) References Cited

U.S. PATENT DOCUMENTS

| 2009/0026550 A1* | 1/2009 | Manabe ...................... 257/369 |
| 2009/0085175 A1* | 4/2009 | Clark et al. ................. 257/637 |

* cited by examiner

*Primary Examiner* — N Drew Richards
*Assistant Examiner* — Mamadou Diallo
(74) *Attorney, Agent, or Firm* — Scully, Scott, Murphy & Presser, P.C.; Yuanmin Cai

(57) ABSTRACT

An epitaxial semiconductor layer may be formed in a first area reserved for p-type field effect transistors. An ion implantation mask layer is formed and patterned to provide an opening in the first area, while blocking at least a second area reserved for n-type field effect transistors. Fluorine is implanted into the opening to form an epitaxial fluorine-doped semiconductor layer and an underlying fluorine-doped semiconductor layer in the first area. A composite gate stack including a high-k gate dielectric layer and an adjustment oxide layer is formed in the first and second area. P-type and n-type field effect transistors (FET's) are formed in the first and second areas, respectively. The epitaxial fluorine-doped semiconductor layer and the underlying fluorine-doped semiconductor layer compensate for the reduction of the decrease in the threshold voltage in the p-FET by the adjustment oxide portion directly above.

17 Claims, 5 Drawing Sheets

THRESHOLD VOLTAGE IMPROVEMENT EMPLOYING FLUORINE IMPLANTATION AND ADJUSTMENT OXIDE LAYER

FIELD OF THE INVENTION

The present invention generally relates to semiconductor devices, and particularly to field effect transistors having different threshold voltages through a combination of fluorine implantation and an adjustment oxide layer, and methods of manufacturing the same.

BACKGROUND OF THE INVENTION

Advanced semiconductor chips employ multiple types of field effect transistors having different threshold voltages, on-current per unit width, and off-current per unit length. Field effect transistors having a high threshold voltage are typically called "low power" devices, which have a low on-current and a low off-current. Field effect transistors having a low threshold voltage are called "high performance" devices, which has a high on-current and a high off-current. By employing a mixture of low power devices and high performance devices, a semiconductor chip may provide optimal performance at an optimal power consumption level.

Devices having different threshold voltages may be obtained by varying dopant concentration of a doped semiconductor well in which the body of a field effect transistor is formed for each value of the threshold voltages. Thus, a high performance device employs a doped semiconductor well having a low dopant concentration, while a low power device employs another doped semiconductor well having a high dopant concentration. Conventionally, for each setting of well doping, a dedicated implantation mask is employed during a corresponding ion implantation step for formation of a doped semiconductor well, which increases processing complexity and cost of manufacturing.

In addition to increased processing cost, low power devices employing a doped semiconductor well having a high dopant concentration also suffer from increased junction leakage. Typically, low power field effect transistors display a value of reverse junction leakage current over forward junction leakage current ratio that is many orders of magnitude higher than a corresponding value for high performance devices. Thus, low power field effect transistors require a high threshold voltage. Because complementary metal-oxide-semiconductor (CMOS) circuits employ both p-type field effect transistors and n-type field effect transistors, both p-type field effect transistors having a high threshold voltage and n-type field effect transistors having a high threshold voltage are necessary to provide low-power complementary metal-oxide-semiconductor (CMOS) circuits.

N-type field effect transistors having a high threshold voltage may be formed by employing a gate dielectric having a composite stack of a high dielectric constant (high-k) gate dielectric and an adjustment oxide layer. However, such a stack produces unacceptably low threshold voltages for p-type field effect transistors.

Selective removal of the adjustment oxide layer only from areas of p-type field effect transistors while maintaining the adjustment oxide in areas of n-type field effect transistors has been proposed to increase threshold voltages in p-type field effect transistors. Because the adjustment oxide layer is typically less than 1 nm thick, however, such selective removal of the adjustment oxide while maintaining uniformity of the underlying high-k gate dielectric layer has proven to be difficult for manufacturing purposes.

SUMMARY OF THE INVENTION

The present invention provides a complementary metal-oxide-semiconductor (CMOS) structure having high threshold voltages for both p-type field effect transistors and n-type field effect transistors having the same composite gate stack of a high-k gate dielectric layer and an adjustment oxide layer, and an integration scheme for manufacturing the same without employing selective patterning of the adjustment oxide.

In the present invention, an epitaxial semiconductor layer may be formed in a first area reserved for p-type field effect transistors. An ion implantation mask layer is formed and patterned to provide an opening in the first area, while blocking at least a second area reserved for n-type field effect transistors. Fluorine is implanted into the opening to form a fluorine-doped epitaxial semiconductor layer and an underlying fluorine-doped semiconductor layer in the first area. A composite gate stack including a high-k gate dielectric layer and an adjustment oxide layer is formed in the first area and the second area. Gate stacks, each including a gate conductor and a stack of a high-k gate dielectric and an adjustment oxide portion, are formed in the first and second areas to form at least one p-type field effect transistor in the first area and at least one second n-type field effect transistor in the second area. Both types of transistors have high threshold voltages. The high threshold voltage of the at least one p-type field effect transistor is enabled by the epitaxial fluorine-doped semiconductor layer and the underlying fluorine-doped semiconductor layer that compensate for the reduction of the decrease in the threshold voltage by the adjustment oxide portion directly above.

According to an aspect of the present invention, a semiconductor structure is provided, which includes: a p-type field effect transistor including a first gate stack and located on a semiconductor substrate, the first gate stack including, from bottom to top, a first high dielectric constant (high-k) gate dielectric having a dielectric constant greater than 4.0, a first adjustment oxide portion, and a first conductive gate material portion, wherein the first high-k gate dielectric abuts a fluorine-doped semiconductor layer; and an n-type field effect transistor including a second gate stack and located on the semiconductor substrate, the second gate stack including, from bottom to top, a second high-k gate dielectric having a dielectric constant greater than 4.0, a second adjustment oxide portion, and a second conductive gate material portion, wherein the second high-k gate dielectric abuts a substantially fluorine-free semiconductor layer.

According to another aspect of the present invention, a method of forming a semiconductor structure is provided, which includes: forming at least one fluorine-doped semiconductor layer on a top surface of a semiconductor substrate in a first area, wherein a second area of the semiconductor substrate includes a substantially fluorine-free semiconductor layer; forming an unpatterned stack of a high dielectric constant (high-k) gate dielectric layer, an adjustment oxide layer, and a conductive gate material layer over an entirety of a top surface of a semiconductor substrate; and forming a p-type field effect transistor including a first gate stack on the semiconductor substrate in the first area, wherein the first gate stack includes, from bottom to top, a first high dielectric constant (high-k) gate dielectric having a dielectric constant greater than 4.0, a first adjustment oxide portion, and a first conductive gate material portion.

In one embodiment, the method further includes forming an n-type field effect transistor including a second gate stack on the semiconductor substrate in the second area, wherein the second gate stack includes, from bottom to top, a second high-k gate dielectric having a dielectric constant greater than 4.0, a second adjustment oxide portion, and a second conductive gate material portion.

DETAILED DESCRIPTION OF THE INVENTION

Figure 1:
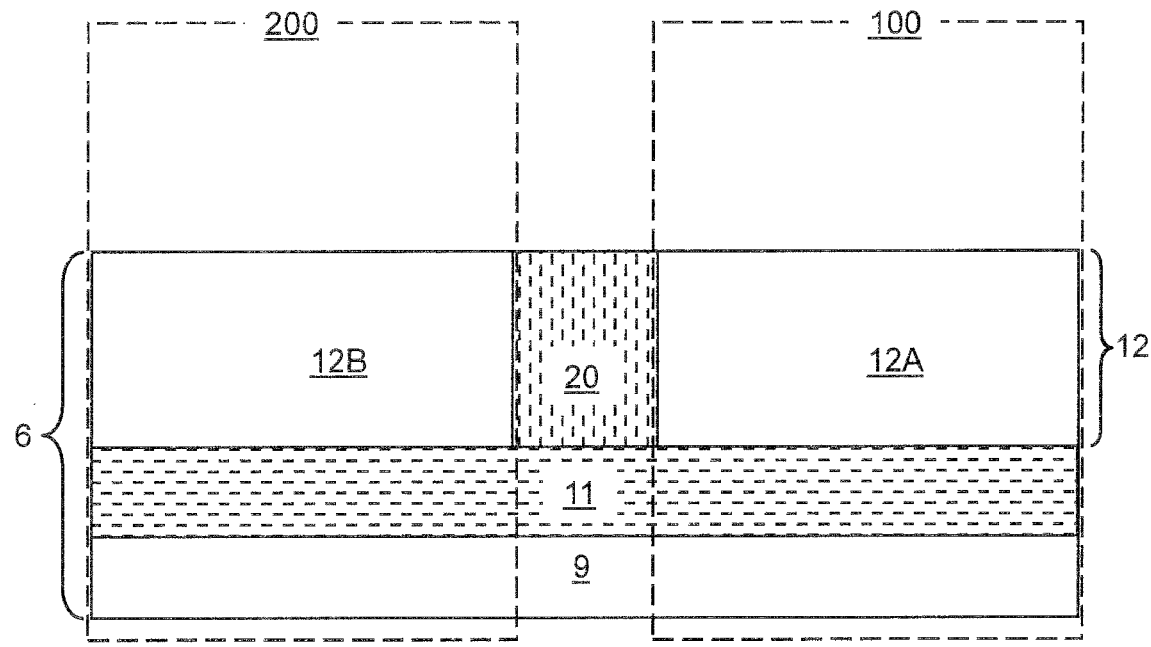
FIG. 1 is a vertical cross-sectional view of a first exemplary semiconductor structure after formation of an n-doped semiconductor region 12A and a p-doped semiconductor region 12B.

As stated above, the present invention relates to field effect transistors having different threshold voltages through gate dielectric stack modification, and methods of manufacturing the same, which are now described in detail with accompanying figures. Like and corresponding elements are referred to by like reference numerals. Proportions of various elements in the accompanying figures are not drawn to scale.

Referring to FIG. 1, a first exemplary semiconductor structure according to a first embodiment of the present invention includes a prototype semiconductor substrate 6. The prototype semiconductor substrate 6 is a semiconductor substrate, i.e., a substrate including a semiconductor portion, and includes a top semiconductor-containing layer 12, which includes a first semiconductor layer 12A located in a first area 100, a second semiconductor layer 12B located in a second area 200, and a shallow trench isolation structure 20. The semiconductor material for the first semiconductor layer 12A and the second semiconductor layer 12B may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the semiconductor material for the first semiconductor layer 12A and the second semiconductor layer 12B is single crystalline, i.e., have the same set of crystallographic orientations, or "epitaxial." For example, the first semiconductor layer 12A and the second semiconductor layer 12B may be single crystalline silicon layers.

The shallow trench isolation structure 20 comprises a dielectric material such as silicon oxide, silicon nitride, silicon oxynitride, or a combination thereof. The prototype semiconductor substrate 6 may be a bulk substrate, a semiconductor-on-insulator (SOI) substrate, or a hybrid substrate having a bulk portion and an SOI portion. The prototype semiconductor substrate 6 may further included a buried insulator layer 11, and a handle substrate 9. The buried insulator layer 11 comprises a dielectric material such as dielectric semiconductor oxide or dielectric semiconductor nitride. The handle substrate 9 may comprise a semiconductor material, an insulator material, a conductor material, or a combination thereof. For example, the handle substrate may be a single crystalline silicon substrate. While the present invention is described with a semiconductor-on-insulator (SOI) substrate, embodiments employing a bulk substrate or a hybrid substrate are explicitly contemplated herein.

The first semiconductor layer 12A has an n-type doping and the second semiconductor layer 12B has a p-type doping. Typically, the first semiconductor layer 12A and the second semiconductor layer 12B are formed by selectively implanting n-type dopants or p-type dopants into non-overlapping portions of a top semiconductor layer of an SOI substrate or a top portion of a bulk substrate or a hybrid substrate. In this case, the top surface of the first semiconductor layer 12A and the second semiconductor layer 12B may be substantially coplanar. The first semiconductor layer 12A may be an n-type well, and the second semiconductor layer 12B may be a p-type well. Typically, the dopant concentration in the first and second semiconductor layers (12A, 12B) may have a value from $1.0 \times 10^{14}/cm^3$ atoms/$cm^3$ to $3.0 \times 10^{19}/cm^3$ atoms/$cm^3$, and preferably a value from $1.0 \times 10^{16}/cm^3$ atoms/$cm^3$ to $3.0 \times 10^{18}/cm^3$ atoms/$cm^3$, although lesser and greater dopant concentrations are also contemplated herein. At this step, the first semiconductor layer 12A and the second semiconductor layer 12B are substantially free of fluorine. A semiconductor layer is substantially free of fluorine if the concentration of fluorine does not exceed a trace level, which is less than $1.0 \times 10^{14}/cm^3$.

A third semiconductor layer (not shown) having an n-type doping may be formed in a third region (not shown) of the prototype semiconductor substrate 6 and a fourth semiconductor layer (not shown) having a p-type doping may be formed in a fourth region (not shown) of the prototype semiconductor substrate 6 to form additional devices. Additional areas such as a third area (not shown) and a fourth area may be provided in the semiconductor substrate.

Figure 2:
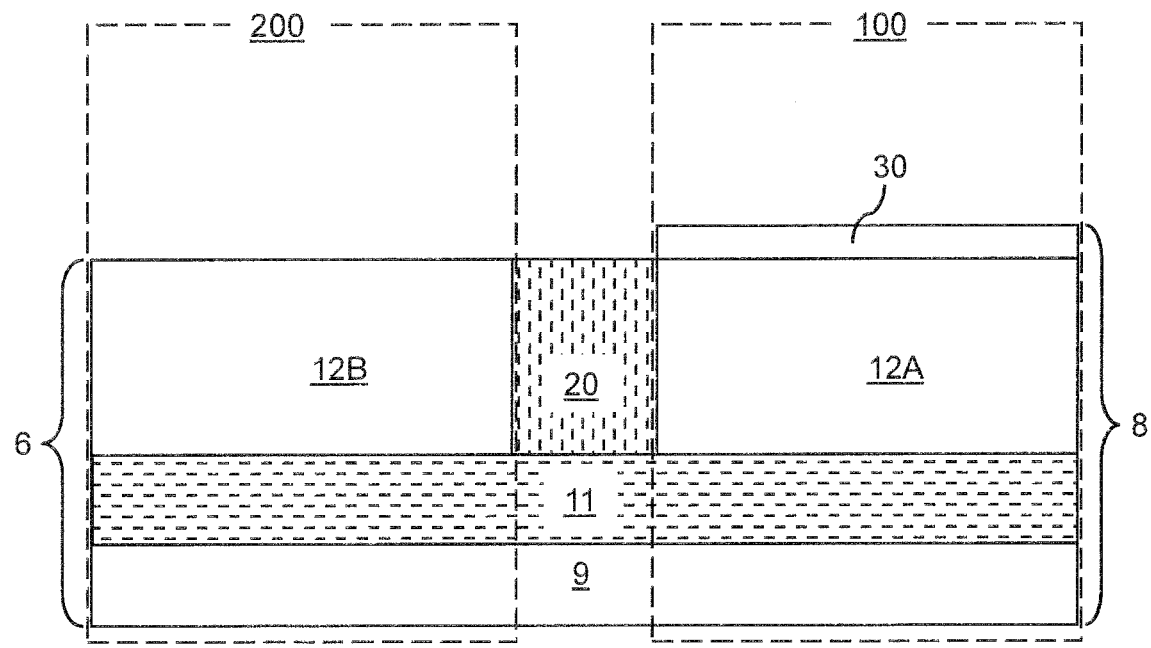
FIG. 2 is a vertical cross-sectional view of the first exemplary semiconductor structure after formation of an epitaxial semiconductor layer.

Referring to FIG. 2, an epitaxial semiconductor layer 30 is formed selectively on the top surface of the first semiconductor layer 12A. The epitaxial semiconductor layer 30 may comprise a different semiconductor material than the first semiconductor layer 12A. For example, if the first semiconductor layer 12A is a single crystalline silicon layer, the epitaxial semiconductor layer 30 may be a single crystalline silicon-germanium alloy layer having an epitaxial alignment with the first semiconductor layer 12A.

The epitaxial semiconductor layer 30 is selectively formed only on the top surface of the first semiconductor layer 12A, while deposition of additional material on the top surface of the second semiconductor layer 12B is prevented. Such selective formation of the epitaxial semiconductor layer 30 may be effected, for example, by deposition of a dielectric masking layer (not shown) and a subsequent patterning of the dielectric masking layer so that the top surface of the first semiconductor layer 12A is exposed, while the top surface of the second semiconductor layer 12B is covered by the dielectric masking layer. A selective epitaxy process deposits a semiconductor material only on exposed semiconductor surfaces, while nucleation or deposition of the semiconductor material on dielectric surfaces is suppressed. After the selective epitaxy, the remaining portion of the dielectric masking layer is removed.

The thickness of the epitaxial semiconductor layer 30 may be from 1 nm to 200 nm, and typically from 3 nm to 50 nm, although lesser and greater thicknesses are also contemplated herein. The epitaxial semiconductor layer 30 may comprise the same material as, or a different material from, the first semiconductor layer 12A. A different material may be preferable in some cases to enhance the mobility of carriers in the channel of a field effect transistor to be subsequently formed in the first area 100. The epitaxial semiconductor layer 30 may be formed with in-situ n-type doping, or without doping. Alternately, the epitaxial semiconductor layer 30 may be autodoped with n-type dopants as the n-type dopants diffuse up from the underlying first semiconductor layer 12A during the deposition of the epitaxial semiconductor layer 30. For example, the first semiconductor layer 12A may be an n-doped single-crystalline silicon layer and the epitaxial semiconductor layer 30 may be an n-doped single-crystalline silicon-germanium alloy layer. The prototype semiconductor layer 6 and the epitaxial semiconductor layer 30 collectively form a semiconductor substrate 8.

Figure 3:
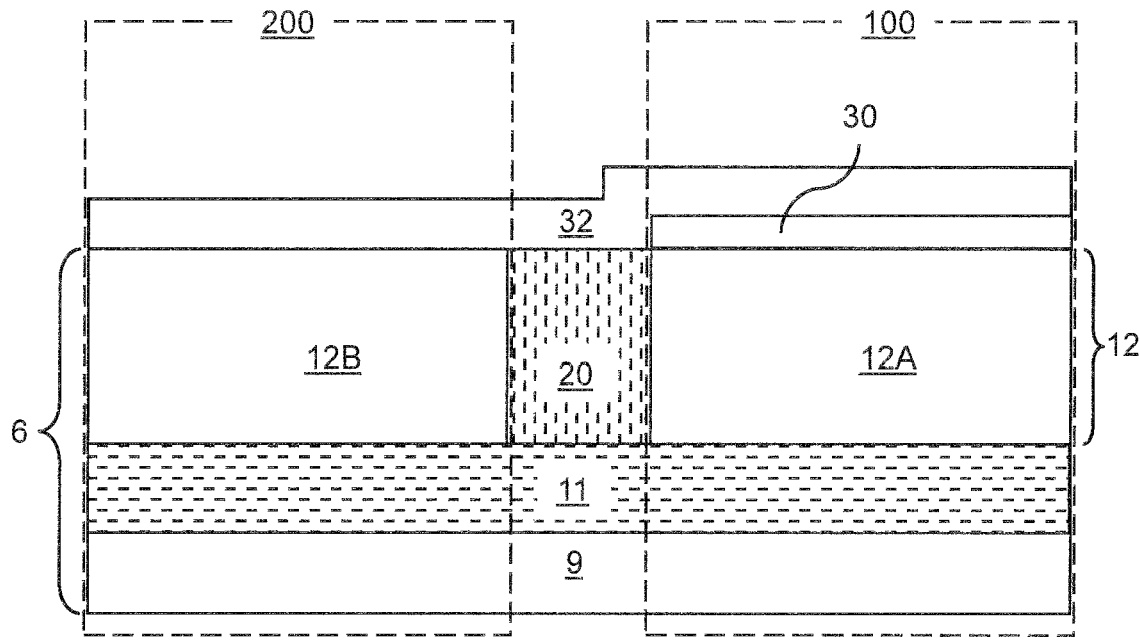
FIG. 3 is a vertical cross-sectional view of the first exemplary semiconductor structure after formation of a semiconductor oxide layer on the semiconductor substrate.

Referring to FIG. 3, an optional process of forming a semiconductor oxide layer 32 on the semiconductor substrate 8 is shown. The semiconductor oxide layer 32 is formed on all exposed semiconductor surfaces including the top surface of the first semiconductor layer 12A and the top surface of the second semiconductor layer 12B. The semiconductor oxide layer 32 may be a single layer of a semiconductor oxide such as silicon oxide, or may comprise a dielectric stack including a semiconductor oxide, a semiconductor nitride, and a semiconductor oxide (ONO stack). The thickness of the semiconductor oxide layer 32 may be from 1 nm to 12 nm, although lesser and greater thicknesses are also contemplated herein. The semiconductor oxide layer 32 may be employed for devices other than field effect transistors requiring the thinnest gate dielectric. For example, the semiconductor oxide layer 32 may be employed in the third area (not shown) and the fourth area (not shown) of the prototype semiconductor substrate 6 to form additional p-type field effect transistors and n-type field effect transistors, respectively, that employ a gate dielectric having a medium range effective oxide thickness (EOT), e.g., greater than 1.5 nm.

Figure 4:
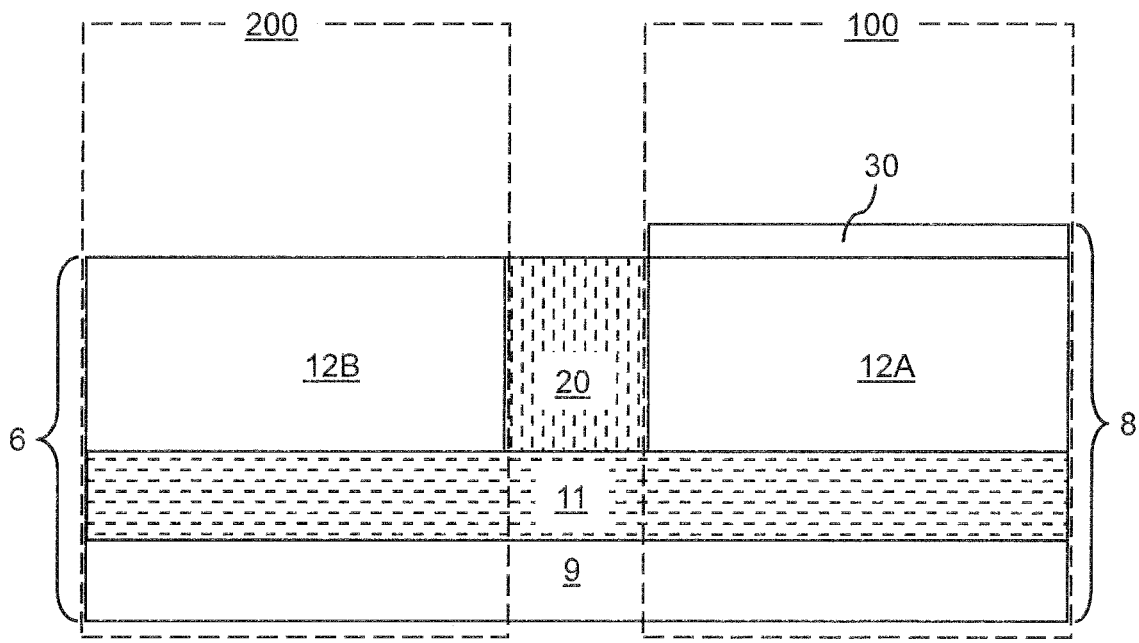
FIG. 4 is a vertical cross-sectional view of the first exemplary semiconductor structure after removal of the semiconductor oxide from a first area and the second area.

Referring to FIG. 4, the semiconductor oxide layer 32 is removed from first and second areas (100, 200), i.e., from the top surfaces of the first semiconductor layer 12A and the second semiconductor layer 12B. In general, the semiconductor oxide layer 32 is removed from areas in which field effect transistors requiring the least effective oxide thickness (EOT) are formed or semiconductor surfaces are desired. For example, the semiconductor oxide layer 32 may be maintained in the third and fourth regions (not shown) in which additional p-type field effect transistors and n-type field effect transistors are subsequently formed. Selective removal of the semiconductor oxide layer 32 may be effected by forming a patterned etch mask layer (not shown) and causing an etchant to etch only the exposed portions of the semiconductor oxide layer 32 through openings in the patterned etch mask layer, while the unexposed portions of the semiconductor oxide 32 are not etched. The patterned etch mask layer may be, for example, a patterned photoresist layer. The patterned etch mask layer is subsequently removed selective to the semiconductor oxide layer 32.

Figure 5:
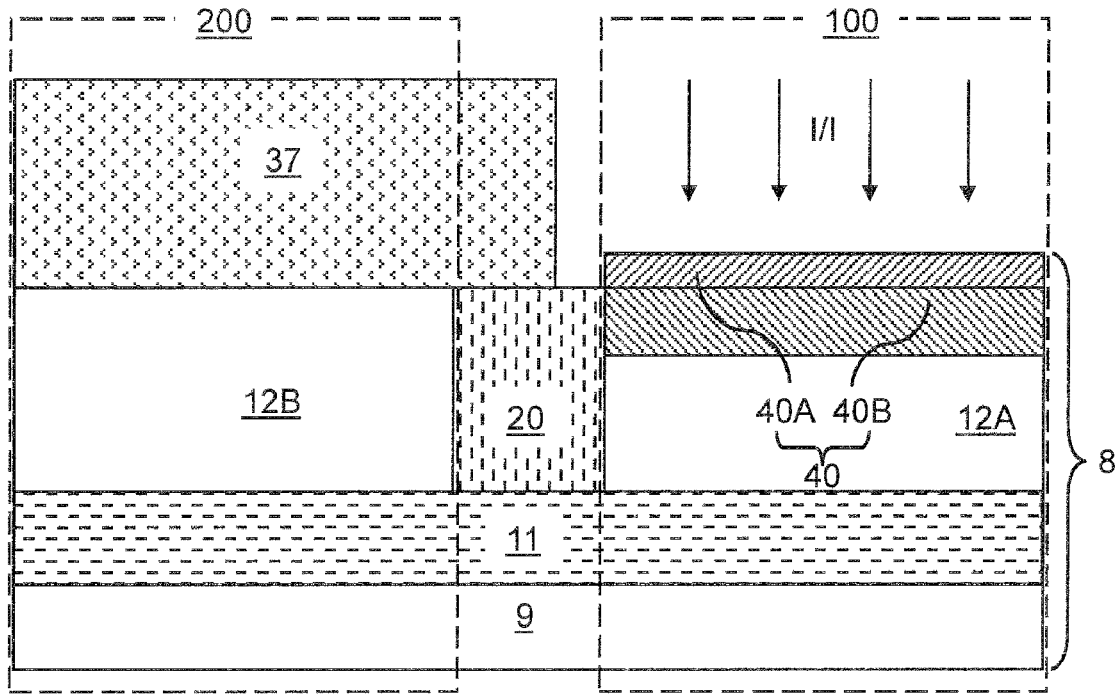
FIG. 5 is a vertical cross-sectional view of the first exemplary semiconductor structure at the step of a masked ion implantation that forms an epitaxial fluorine-doped semiconductor layer and an underlying fluorine-doped semiconductor layer.

Referring to FIG. 5, an ion implantation mask layer 37 is formed on a top surface of the semiconductor substrate 8. The ion implantation mask layer 37 may be, for example, a photoresist layer. The ion implantation mask layer 37 is patterned to form an opening in at least the first area 100 to expose the top surface of the epitaxial semiconductor layer 30 (See FIG. 4), while covering the second area 200. The third area and the fourth area (not shown) may be covered at this step.

Fluorine-containing ions are implanted through the at least one opening in the ion implantation mask layer 37 into the exposed portions of the semiconductor substrate 8 within the first area 100. The fluorine-containing ions may be, for example, $F^-$ or $BF_2^-$ ions. The ion implantation mask layer 37 blocks the fluorine-containing ions in the second area 200. The fluorine-containing ions convert the epitaxial semiconductor layer 30 and an upper portion of the first semiconductor layer 12A into fluorine-doped semiconductor layers. Specifically, the fluorine-containing ions convert the epitaxial semiconductor layer 30 into a first fluorine-doped semiconductor layer 40A, which is an overlying fluorine-doped semiconductor layer, and the upper portion of the first semiconductor layer 12A into a second fluorine-doped semiconductor layer 40B, which is an underlying fluorine-doped semiconductor layer. The first fluorine-doped semiconductor layer 40A and the second fluorine-doped semiconductor layer 40B are herein collectively referred to as at least one fluorine-doped semiconductor layer 40. The first fluorine-doped semiconductor layer 40A and the second fluorine-doped semiconductor layer 40B include fluorine at a dopant concentration greater than a trace level concentration. Thus, the first fluorine-doped semiconductor layer 40A and the second fluorine-doped semiconductor layer 40B include fluorine at a dopant concentration greater than $1.0 \times 10^{14}/cm^3$, and preferably at a dopant concentration from $1.0 \times 10^{17}/cm^3$ to $1.0 \times 10^{21}/cm^3$, although greater and lesser fluorine concentrations are also contemplated herein. The volume of the first semiconductor layer 12A is reduced by the volume of the second fluorine-doped semiconductor layer 40B, i.e., by the volume that is implanted by the fluorine-containing ions.

The above steps produce a structure including at least one fluorine-doped semiconductor layer 40 on a top surface of the semiconductor substrate 8 in a first area 100, while the second area 200 of the semiconductor substrate 8 includes a substantially fluorine-free semiconductor layer, which is the second semiconductor layer 12B. In some embodiments, the second fluorine-doped semiconductor layer 40B and the second semiconductor layer 12B comprise the same semiconductor material, which is different from the semiconductor material of the first fluorine-doped semiconductor layer 40A. For example, the second fluorine-doped semiconductor layer 40B and the second semiconductor layer 12B may be single crystalline silicon layers, and the first fluorine-doped semiconductor layer 40A may be a single crystalline silicon-germanium alloy layer.

The first and second fluorine-doped semiconductor layers (40A, 40B) have an n-type doping, and the second semiconductor layer 12B, which is a substantially fluorine-free semiconductor layer, has a p-type doping. The ion implantation mask layer 37 is subsequently removed.

Figure 6:
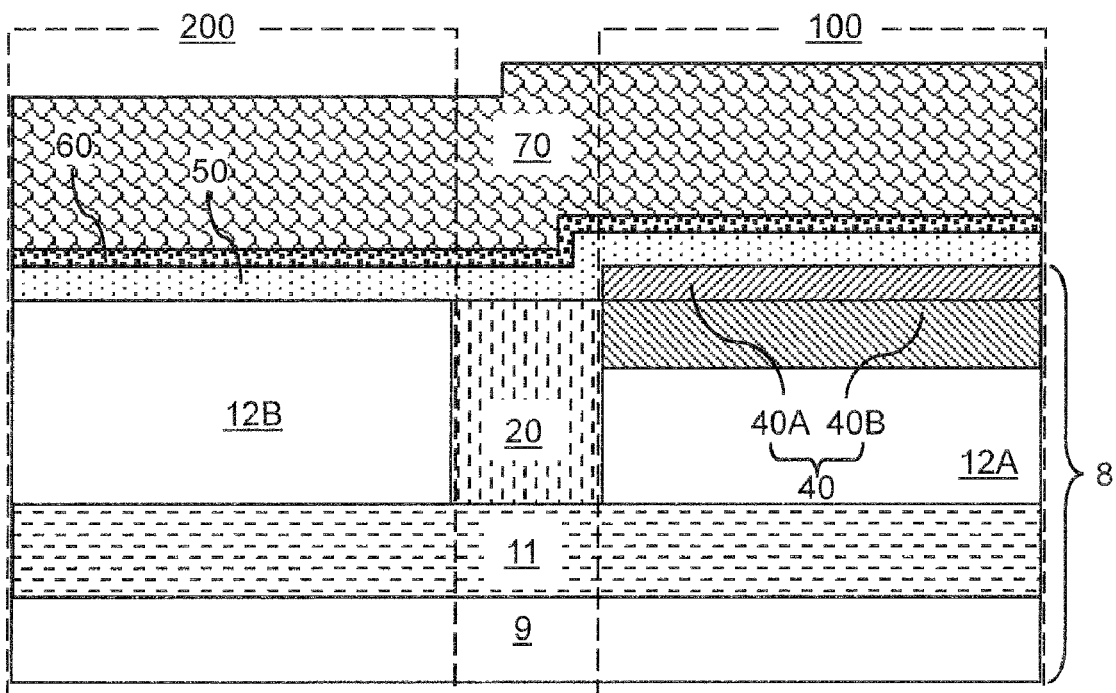
FIG. 6 is a vertical cross-sectional view of the first exemplary semiconductor structure after formation of an unpatterned stack of a high dielectric constant (high-k) gate dielectric layer, an adjustment oxide layer, and a conductive gate material layer over the entirety of a top surface of the semiconductor substrate.

Referring to FIG. 6, a high dielectric constant (high-k) gate dielectric layer 50 is deposited on the entirety of the top surface of the semiconductor substrate 8. The high-k gate dielectric layer 50 is formed on the exposed surfaces of the first fluorine-doped semiconductor layer 40A and the second semiconductor layer 12B by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The high-k gate dielectric layer 50 includes a dielectric metal oxide having a dielectric constant that is greater than the dielectric constant of silicon oxide of 3.9. Typically, the high-k gate dielectric layer 50 has a dielectric constant greater than 4.0. Preferably, the high-k gate dielectric layer 50 has a dielectric constant greater than 8.0. The dielectric metal oxide is a high-k material containing a metal and oxygen, and is known in the art as high-k gate dielectric materials. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k gate dielectric layer 50 may be from 0.9 nm to 6 nm, and preferably from 1.2 nm to 3 nm. The high-k gate dielectric layer 50 may have an effective oxide thickness on the order of or less than 1 nm.

Without patterning the high-k gate dielectric layer 50, an adjustment oxide layer 60 is deposited directly on the exposed surfaces of the high-k gate dielectric layer 50 by methods well known in the art including, for example, CVD, PVD, MBD, PLD, LSMCD, ALD, etc. The adjustment oxide layer 60 comprises one of the group IIA elements and the group IIIB elements. Specifically, the adjustment oxide layer 60 may comprise Be, Mg, Ca, Sr, Ba, Ra, Sc, Y, La, Ce, Pr, Nd, Pm, Sm, Eu, Gd, Tb, Dy, Ho, Er, Tm, Yb, Lu, or a combination thereof. Typically, the adjustment oxide layer 60 consists of an oxide of Be, Mg, Ca, Sr, Ba, Ra, Sc, Y, La, Ce, Pr, Nd, Pm, Sm, Eu, Gd, Tb, Dy, Ho, Er, Tm, Yb, Lu, or a combination thereof. The thickness of the adjustment oxide layer 60 may be from about 0.1 nm to about 0.8 nm, although lesser and greater thicknesses are also explicitly contemplated.

Without patterning the adjustment oxide layer 60, a conductive gate material layer 70 is formed directly on the adjustment oxide layer 60. In other words, the vertical stack of the high-k gate dielectric layer 50, the adjustment oxide layer 60, and the conductive gate material layer 70 are formed as blanket layers without any patterning. The conductive gate material layer 70 may be a metallic layer, a conductive semiconductor layer, or a combination thereof.

In case a metallic layer is included in the conductive gate material layer 70, the metallic layer may contain a metal or a conductive metallic alloy. Non-limiting examples of the material that may be employed for the metallic layer include W, Ta, TiN, ZrN, HfN, VN, NbN, TaN, WN, TiAlN, TaC, TaMgC, TaCN, another conductive refractory metal nitride, or a combination or an alloy thereof. Such a metallic layer may be formed by chemical vapor deposition (CVD), physical vapor deposition (PVD), atomic layer deposition (ALD), vacuum evaporation, etc. The metallic layer may comprise a metal from Group IVB or VB of the Periodic Table of Elements or other transition metals. The thickness of the metal layer may be from 5 nm to 100 nm, and typically from 10 nm 50 nm, although lesser and greater thicknesses are also contemplated herein.

In case a semiconductor layer is included in the conductive gate material layer 70, the semiconductor layer may comprise a polycrystalline or amorphous semiconductor material, which includes at least one of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor layer may be deposited with in-situ doping as a doped semiconductor material layer, or may be deposited as an undoped semiconductor material layer and subsequently doped by ion implantation. The thickness of the semiconductor layer may be from about 10 nm to about 120 nm, although lesser and greater thicknesses are also explicitly contemplated herein.

Thus, an unpatterned stack of the high high-k gate dielectric layer 50, the adjustment oxide layer 60, and the conductive gate material layer 70 is formed over an entire top surface of the semiconductor substrate 8.

Figure 7:
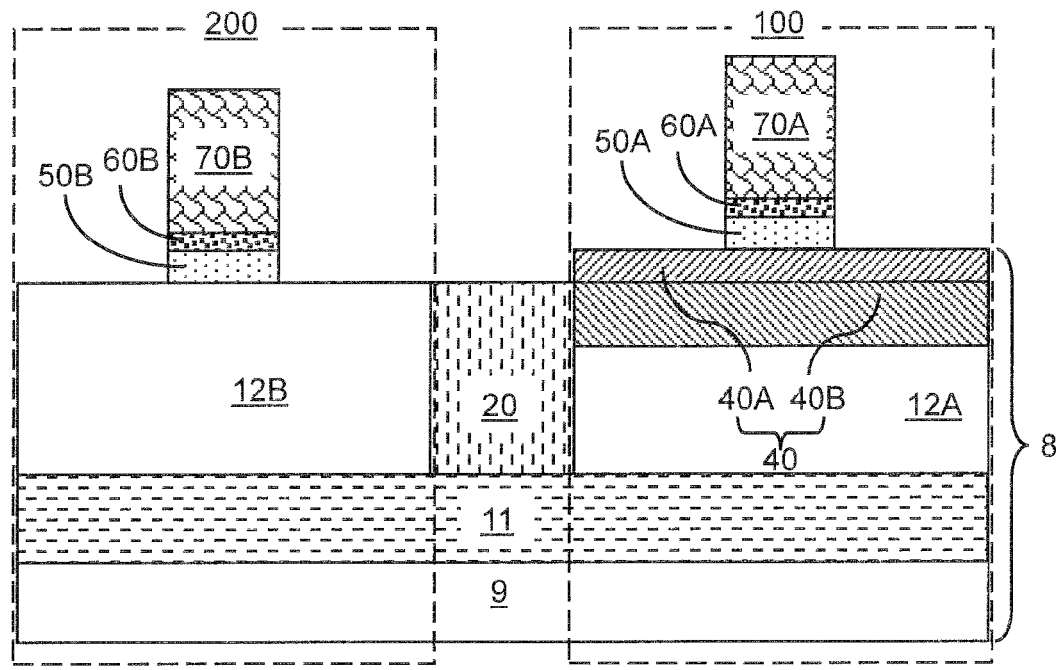
FIG. 7 is a vertical cross-sectional view of the first exemplary semiconductor structure after patterning of a first gate stack and a second gate stack.

Referring to FIG. 7, a first gate stack and a second gate stack are formed by lithographically patterning the stack of the high-k gate dielectric layer 50, the adjustment oxide layer 60, and the conductive gate material layer 70. The first gate stack is formed in the first area 100, and the second gate stack is formed in the second area 200. The first gate stack includes, from bottom to top, a first high dielectric constant (high-k) gate dielectric 50A, a first adjustment oxide portion 60A, and a first conductive gate material portion 70A. The second gate stack includes, from bottom to top, a second high-k gate dielectric 50B, a second adjustment oxide portion 60B, and a second conductive gate material portion 70B. The patterning of the stack of the high-k gate dielectric layer 50, the adjustment oxide layer 60, and the conductive gate material layer 70 may be performed in a same step, or may be performed in multiple consecutive steps. In either case, the sidewalls of each of the first and second gate stack are substantially vertically coincident.

The first high-k gate dielectric 50A and the second high-k gate dielectric 50B are formed by patterning the high-k gate dielectric layer 50. The first adjustment oxide portion 60A and the second adjustment oxide portion 60B are formed by patterning the adjustment oxide layer 60. The first conductive gate material portion 70A and the second conductive gate material portion 70B are formed by patterning the conductive gate material layer 70. The same pattern is transferred through the stack of the high-k gate dielectric layer 50, the adjustment oxide layer 60, and the conductive gate material layer 70 to form the first and second gate stacks. Thus, the sidewalls of the first high-k gate dielectric 50A are substantially vertically coincident with the sidewalls of the first adjustment oxide portion 60A and the sidewalls of the first conductive gate material portion 70A. Likewise, the sidewalls of the second high-k gate dielectric 50B are substantially vertically coincident with the sidewalls of the second adjustment oxide portion 60B and the sidewalls of the second conductive gate material portion 70B.

Because the high-k gate dielectric layer 50 is formed directly on the top surface of the first fluorine-doped semiconductor layer 40A, the first high-k gate dielectric 50A abuts the first fluorine-doped semiconductor layer 40A. Likewise, the second high-k gate dielectric 50B abuts the second semiconductor layer 12B, which is a substantially fluorine-free semiconductor layer. The first high-k gate dielectric 50A has the same composition and thickness as the second high-k gate dielectric 50B. The first adjustment oxide portion 60A has the same composition and thickness as the second adjustment oxide portion 60B.

Figure 8:
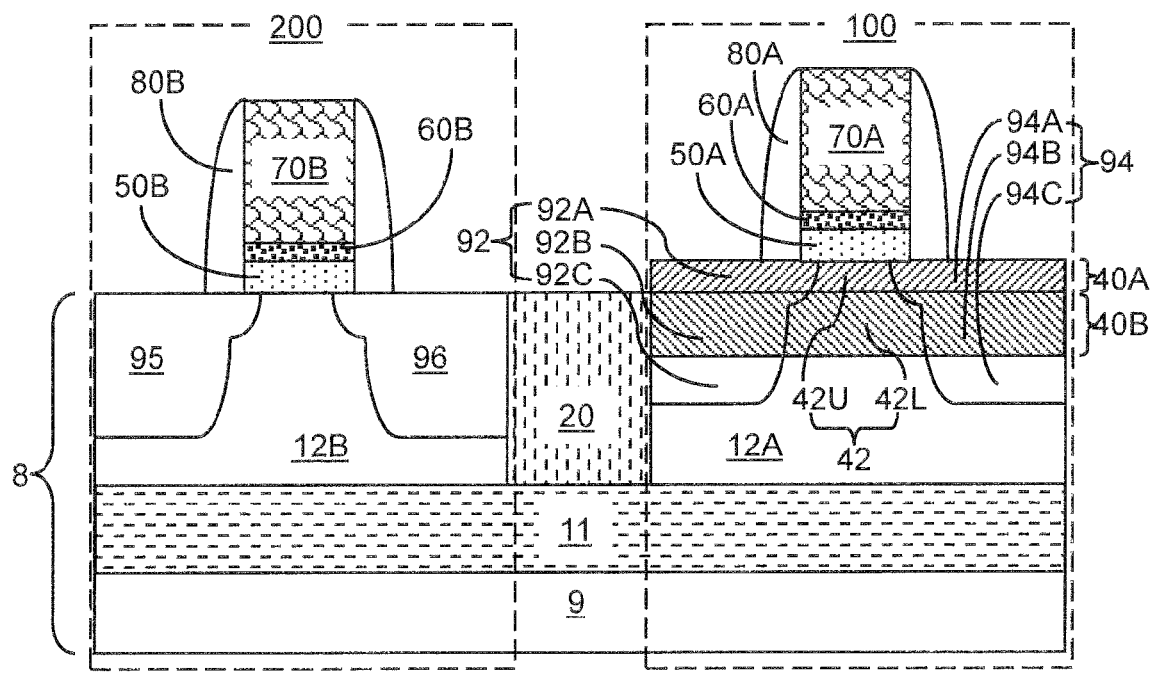
FIG. 8 is a vertical cross-sectional view of the first exemplary semiconductor structure after formation of a p-type field effect transistor in the first area and an n-type field effect transistor in the second area.

Referring to FIG. 8, a p-type field effect transistor including the first gate stack (50A, 60A, 70A) is formed in the first area 100, and an n-type field effect transistor including the second gate stack (50B, 60B, 70B) is formed in the second area 200. Source and drain extension regions (not shown separately) and halo regions (not shown separately) in the n-doped semiconductor region 12A and the p-doped semiconductor region 12B are formed by ion implantation. Thereafter, first and second dielectric gate spacers (80A, 80B) are formed by methods known in the art, i.e., deposition of a conformal dielectric material layer followed by an anisotropic etch that removes horizontal portions, whereby the remaining vertical portions of the conformal dielectric material layer becomes the first and second gate spacers (80A, 80B). Subsequently, deep source and drain ion implantations are performed to form the first source region 92, the first drain region 94, a second source region 95, and a second drain region 96.

The p-type field effect transistor includes a first dielectric gate spacer 80A, a first source region 92, and a first drain region 94. Each of the first source region 92 and the first drain region 94 has a p-type doping and including a portion of the first fluorine-doped semiconductor layer 40A and a portion of the second fluorine-doped semiconductor layer 40B. Specifically, the first source region 92 includes a first fluorine-doped semiconductor source portion 92A and a second fluorine-doped semiconductor source portion 92B. The first fluorine-doped semiconductor source portion 92A is a portion of the first fluorine-doped semiconductor layer 40A on the source side, and the second fluorine-doped semiconductor source portion 92B is a portion of the second fluorine-doped semiconductor layer 40B on the source side. Likewise, the first drain region 94 includes a first fluorine-doped semiconductor drain portion 94A and a second fluorine-doped semiconductor drain portion 94B. The first fluorine-doped semiconductor drain portion 94A is a portion of the first fluorine-doped semiconductor layer 40A on the drain side, and the second fluorine-doped semiconductor drain portion 94B is a portion of the second fluorine-doped semiconductor layer 40B on the drain side.

Some processes employed after deposition of the high-k gate dielectric layer 50 employ high temperatures, i.e., temperatures above 800° C. Such high temperature processes induce diffusion of some fluorine atoms into the portion of the high-k gate dielectric layer 50 from a fluorine-doped semiconductor layer located directly underneath, e.g., from the first fluorine-doped semiconductor layer 40A. Such high temperature processes include an activation anneal in which implanted dopants are activated, i.e., moves from interstitial sites into substitutional sites, within the first source region 92, the first drain region 94, a second source region 95, and a second drain region 96. For example, an activation anneal is performed at a temperature from 900° C. to 1050° C. after formation of various source and drain regions (92, 94, 95, 96), although lesser and greater temperatures are also contemplated herein.

The diffusion of the fluorine atoms dopes the first high-k gate dielectric 50A with fluorine, while the second high-k gate dielectric 50B remains substantially fluorine-free, i.e., the concentration of fluorine in the second high-k gate dielectric 50B remains at trace level ($1.0 \times 10^{14}/cm^3$) or below. The atomic concentration of fluorine atoms in the first high-k gate dielectric 50A may be from 1 p.p.m. (parts per million) to 10%, and preferably from 10 p.p.m. to 1%, although lesser and greater atomic concentrations are also contemplated herein. Thus, the p-type field effect transistor in the first area 100 includes a gate dielectric comprising a stack of a fluorine-doped high-k gate dielectric (the first high-k gate dielectric 50A) and the first adjustment oxide portion 60A. The n-type field effect transistor in the second area 200 includes a gate dielectric comprising a stack of a substantially fluorine-free high-k gate dielectric (the second high-k gate dielectric 50B) and the second adjustment oxide portion 60B. The second high-k gate dielectric 50B has a material composition that is different from the first high-k gate dielectric 50A only by the presence of fluorine atoms.

Optionally, each of the first source region 92 and the first drain region 94 may further include a substantially fluorine-free p-doped semiconductor region located directly beneath the second fluorine-doped semiconductor layer 40B. In this case, the first source region 92 includes a substantially fluorine-free p-doped source portion 92C located directly beneath the second fluorine-doped semiconductor source portion 92B, and the first drain region 94 includes a substantially fluorine-free p-doped drain portion 94C located directly beneath the second fluorine-doped semiconductor drain portion 94B.

The body of the p-type field effect transistor includes a first n-doped fluorine-doped body portion 42U and a second n-doped fluorine-doped body portion 42L. The first n-doped fluorine-doped body portion 42U has the same dopant concentration as the first fluorine-doped semiconductor layer 40A prior to formation of the first source region 92 and the first drain region 94. The second n-doped fluorine-doped body portion 42L has the same dopant concentration as the second fluorine-doped semiconductor layer 40B prior to formation of the first source region 92 and the first drain region 94.

The n-type field effect transistor includes a second dielectric gate spacer 80B, a second source region 95, and a second drain region 96. Each of the second source region 95 and the second drain region 96 has an n-type doping. Each of the second source region 95 and the second drain region 96 is formed by converting a portion of the second semiconductor layer 12B. The remaining portion of the second semiconductor layer 12B is the body of the n-type field effect transistor. The second source region 95, the second drain region 96, and the body of the n-type field effect transistor (which is the remaining portion of the second semiconductor layer 12B) are substantially fluorine-free.

The combination of the second high-k gate dielectric 50B and the second adjustment oxide portion 60B provides high threshold voltage to the n-type field effect transistor. The fluorine doping in the body of the p-type field effect transistor compensates the lowering of the threshold voltage of the p-type field effect transistor by the presence of the first adjustment oxide portion 60A in the first gate stack (50A, 60A, 70A) so that the threshold voltage of the p-type field effect transistor is sufficiently raised, i.e., the p-type field effect transistor has a sufficiently high threshold voltage due to the fluorine-doped body of the p-type field effect transistor.

Figure 9:
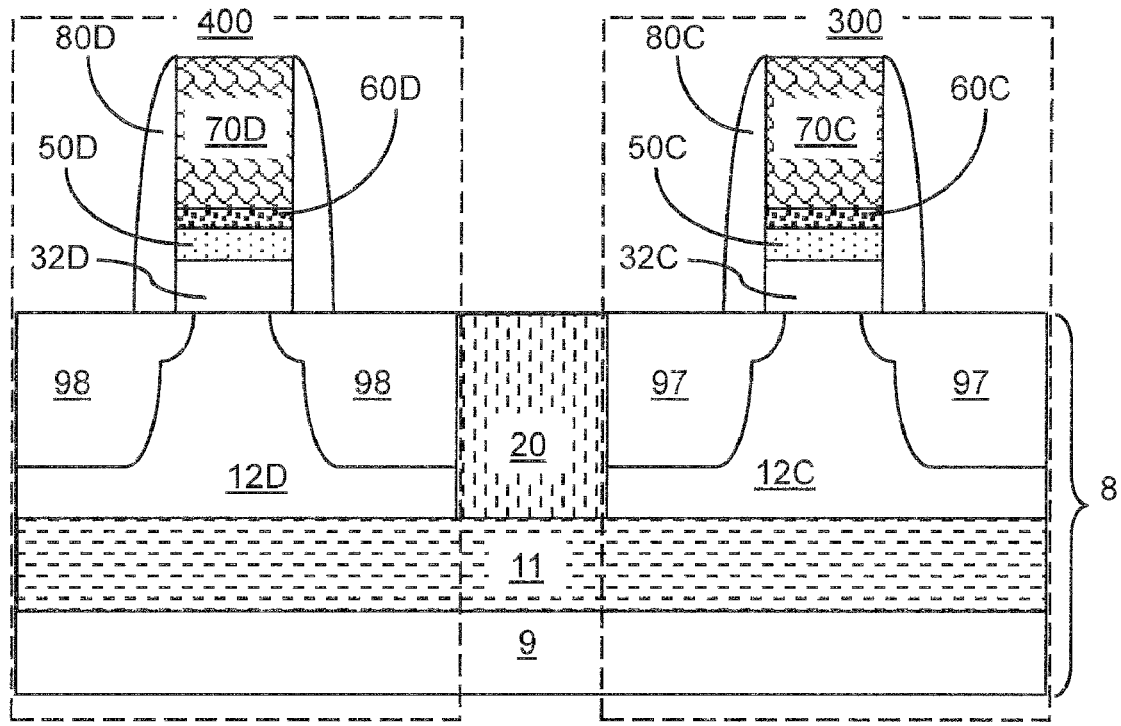
FIG. 9 is a vertical cross-sectional view of a second exemplary semiconductor structure that may be formed concurrently with the first exemplary semiconductor structure at a step corresponding to FIG. 8.

FIG. 9 is a vertical cross-sectional view of a second exemplary semiconductor structure that may be formed concurrently with the first exemplary semiconductor structure at a step corresponding to FIG. 8. The second exemplary semiconductor structure includes a second p-type field effect transistor and a second n-type field effect transistor that are located on the semiconductor substrate 8. The second p-type field effect transistor includes a third gate stack, which includes, from bottom to top, a first semiconductor oxide portion 32C, a third high dielectric constant (high-k) gate dielectric 50C having a dielectric constant greater than 4.0, a third adjustment oxide portion 60C, and a third conductive gate material portion 70C. The second n-type field effect transistor includes a fourth gate stack, which includes, from bottom to top, a second semiconductor oxide portion 32D, a fourth high-k gate dielectric 50D having a dielectric constant greater than 4.0, a fourth adjustment oxide portion 60D, and a fourth conductive gate material portion 70D.

The third gate stack is formed in the third area 300 from which the semiconductor oxide layer 32 (See FIG. 3) is not removed. Likewise, the fourth gate stack is formed in the fourth area 400 from which the semiconductor oxide layer 32 (See FIG. 3) is not removed. The first semiconductor oxide portion 32C and the second semiconductor oxide portion 32D have the same composition as, and substantially the same thickness as, the semiconductor oxide layer 32. The third high-k gate dielectric 50C and the fourth high-k gate dielectric 50D have the same composition as, and substantially the same thickness as, the first and second high-k gate dielectrics (50A, 50B) of FIG. 8. The third adjustment oxide portion 60C and the fourth adjustment oxide portion 60D have the same composition as, and substantially the same thickness as, the first and second adjustment oxide portions (60A, 60B) of FIG. 8. The third conductive gate material portion 70C may have the same composition as the first gate material portion 70A, and the fourth gate material portion 70D may have the same composition as the second gate material portion 70B.

The second p-type field effect transistor and the second n-type field effect transistor have a greater effective oxide thickness than the p-type field effect transistor the n-type field effect transistor in the first exemplary semiconductor structure, and may be employed to provide a circuit requiring lower power consumption (typically at the cost of slower performance) in combination with the p-type field effect transistor the n-type field effect transistor in the first exemplary semiconductor structure.

Figure 10:
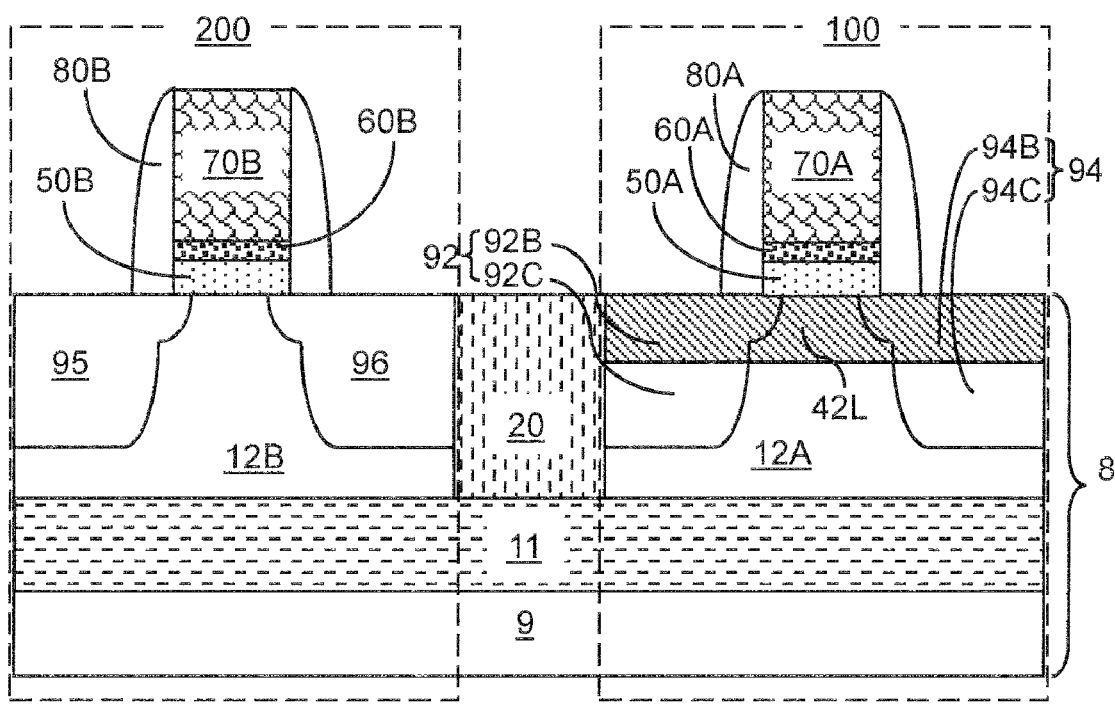
FIG. 10 is a vertical cross-sectional view of a third exemplary semiconductor structure at a step corresponding to FIG. 8.

Referring to FIG. 10, a third exemplary semiconductor structure is shown at a step corresponding to FIG. 8 of the first exemplary semiconductor structure. The third exemplary semiconductor structure is derived from the first exemplary semiconductor structure by omitting the formation of the epitaxial semiconductor layer 30 at the step corresponding to FIG. 2. Thus, the p-type field effect transistor of the third exemplary semiconductor structure does not include any portion that corresponds to the epitaxial semiconductor layer 30, i.e., the p-type field effect transistor of the third exemplary semiconductor structure does not include a first fluorine-doped semiconductor source portion 92A, a second fluorine-doped semiconductor source portion 92B, and a first n-doped fluorine-doped body portion 42U.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a p-type field effect transistor including a first gate stack and located on a semiconductor substrate, said first gate stack including, from bottom to top, a first high dielectric constant (high-k) gate dielectric having a dielectric constant greater than 4.0, a first adjustment oxide portion, and a first conductive gate material portion, wherein said first high-k gate dielectric abuts a fluorine-doped semiconductor layer;
an n-type field effect transistor including a second gate stack and located on said semiconductor substrate, said second gate stack including, from bottom to top, a second high-k gate dielectric having a dielectric constant greater than 4.0, a second adjustment oxide portion, and a second conductive gate material portion, wherein said second high-k gate dielectric abuts a substantially fluorine-free semiconductor layer; and
another fluorine-doped semiconductor layer located directly beneath said fluorine-doped semiconductor layer and including a different semiconductor material, wherein said another fluorine-doped semiconductor layer and said substantially fluorine-free semiconductor layer have substantially coplanar top surfaces.

2. The semiconductor structure of claim 1, wherein said first high-k gate dielectric has a same composition and thickness as said second high-k gate dielectric, and wherein said first adjustment oxide portion has a same composition and thickness as said second adjustment oxide portion.

3. The semiconductor structure of claim 2, wherein said first high-k gate dielectric and said second high-k gate dielectric comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy thereof, and non-stoichiometric variants thereof, wherein each value of x is independently from about 0.5 to about 3 and each value of y is independently from 0 to about 2.

4. The semiconductor structure of claim 2, wherein said first adjustment oxide portion and said second adjustment oxide portion comprise Be, Mg, Ca, Sr, Ba, Ra, Sc, Y, La, Ce, Pr, Nd, Pm, Sm, Eu, Gd, Tb, Dy, Ho, Er, Tm, Yb, Lu, or a combination thereof.

5. The semiconductor structure of claim 1, wherein said fluorine-doped semiconductor layer has an n-type doping, and wherein said substantially fluorine-free semiconductor layer has a p-type doping.

6. The semiconductor structure of claim 1, wherein said fluorine-doped semiconductor layer is a fluorine-doped single crystalline silicon-germanium alloy layer, and wherein said another fluorine-doped semiconductor layer is a fluorine-doped single-crystalline silicon layer.

7. The semiconductor structure of claim 6, wherein said p-type field effect transistor further comprises a first source region and a first drain region, each having a p-type doping and including a portion of said fluorine-doped semiconductor layer and a portion of said another fluorine-doped semiconductor layer, wherein each of said first source region and said first drain region includes a substantially fluorine-free p-doped semiconductor region located beneath said fluorine-doped semiconductor layer.

8. The semiconductor structure of claim 1, wherein said first high-k gate dielectric is fluorine-doped, and wherein said second high-k gate dielectric is substantially fluorine-free.

9. The semiconductor structure, comprising:
a p-type field effect transistor including a first gate stack and located on a semiconductor substrate, said first gate stack including, from bottom to top, a first high dielectric constant (high- k) gate dielectric having a dielectric constant greater than 4.0, a first adjustment oxide portion, and a first conductive gate material portion, wherein said first high-k gate dielectric abuts a fluorine-doped semiconductor layer;
an n-type field effect transistor including a second gate stack and located on said semiconductor substrate, said second gate stack including, from bottom to top, a second high-k gate dielectric having a dielectric constant greater than 4.0, a second adjustment oxide portion,
and a second conductive gate material portion, wherein said second high-k gate dielectric abuts a substantially fluorine-free semiconductor layer;
another p-type field effect transistor located on said semiconductor substrate, wherein said another p-type field effect transistor includes a third gate stack, said third gate stack including, from bottom to top, a first semiconductor oxide portion, a third high dielectric constant (high-k) gate dielectric having a dielectric constant greater than 4.0, a third adjustment oxide portion, and a third conductive gate material portion, wherein said first semiconductor oxide portion abuts another substantially fluorine-free semiconductor layer; and
another n-type field effect transistor located on said semiconductor substrate, wherein said another n-type field effect transistor includes a fourth gate stack, said fourth gate stack including, from bottom to top, a second semiconductor oxide portion, a fourth high-k gate dielectric having a dielectric constant greater than 4.0, a fourth adjustment oxide portion, and a fourth conductive gate material portion, wherein said second semiconductor oxide portion abuts yet another substantially fluorine-free semiconductor layer.

10. The semiconductor structure of claim 9, wherein said first high-k gate dielectric has a same composition and thickness as said second high-k gate dielectric, and wherein said first adjustment oxide portion has a same composition and thickness as said second adjustment oxide portion.

11. The semiconductor structure of claim 10, wherein said first high-k gate dielectric and said second high-k gate dielectric comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy thereof, and non-stoichiometric variants thereof, wherein each value of x is independently from about 0.5 to about 3 and each value of y is independently from 0 to about 2.

12. The semiconductor structure of claim 10, wherein said first adjustment oxide portion and said second adjustment oxide portion comprise Be, Mg, Ca, Sr, Ba, Ra, Sc, Y, La, Ce, Pr, Nd, Pm, Sm, Eu, Gd, Tb, Dy, Ho, Er, Tm, Yb, Lu, or a combination thereof.

13. The semiconductor structure of claim 9, wherein said fluorine-doped semiconductor layer has an n-type doping, and wherein said substantially fluorine-free semiconductor layer has a p-type doping.

14. The semiconductor structure of claim 9, further comprising another fluorine-doped semiconductor layer located directly beneath said fluorine-doped semiconductor layer and including a different semiconductor material, wherein said another fluorine-doped semiconductor layer and said substantially fluorine-free semiconductor layer have substantially coplanar top surfaces.

15. The semiconductor structure of claim 14, wherein said fluorine-doped semiconductor layer is a fluorine-doped single crystalline silicon-germanium alloy layer, and wherein said another fluorine-doped semiconductor layer is a fluorine-doped single-crystalline silicon layer.

16. The semiconductor structure of claim 15, wherein said p-type field effect transistor further comprises a first source region and a first drain region, each having a p-type doping and including a portion of said fluorine-doped semiconductor layer and a portion of said another fluorine-doped semiconductor layer, wherein each of said first source region and said first drain region includes a substantially fluorine-free p-doped semiconductor region located beneath said fluorine-doped semiconductor layer.

17. The semiconductor structure of claim 9, wherein said first high-k gate dielectric is fluorine-doped, and wherein said second high-k gate dielectric is substantially fluorine-free.

* * * * *